US012604433B2

(12) United States Patent
Gardineer, IV

(10) Patent No.: US 12,604,433 B2
(45) Date of Patent: Apr. 14, 2026

(54) SYSTEMS AND METHODS FOR ENVIRONMENTAL CONTROL OF VEHICLE SENSING SYSTEMS

(71) Applicant: LG INNOTEK CO., LTD., Seoul (KR)

(72) Inventor: Bayard G. Gardineer, IV, Princeton, NJ (US)

(73) Assignee: LG INNOTEK CO., LTD., Seoul (KR)

( * ) Notice: Subject to any disclaimer, the term of this patent is extended or adjusted under 35 U.S.C. 154(b) by 232 days.

(21) Appl. No.: 18/322,314

(22) Filed: May 23, 2023

(65) Prior Publication Data

US 2024/0074094 A1      Feb. 29, 2024

Related U.S. Application Data

(60) Provisional application No. 63/400,469, filed on Aug. 24, 2022.

(51) Int. Cl.
*H05K 7/20* (2006.01)
*G01S 7/481* (2006.01)

(52) U.S. Cl.
CPC .......... *H05K 7/20145* (2013.01); *G01S 7/481* (2013.01)

(58) Field of Classification Search
CPC ................ G01S 7/4813; G01S 17/931; G01S 2007/4977; G01S 7/481; G01S 7/4043; G01S 13/426; G01S 17/88; G01S 17/86; G06F 1/20; G06F 2200/201; H05K 7/20145; H05K 7/20154; H05K 7/20172; H05K 7/20136; H01L 23/467; G03B 21/2033; G03B 21/16
USPC .......... 361/695, 719, 679.46, 679.49, 679.48
See application file for complete search history.

(56) References Cited

U.S. PATENT DOCUMENTS

| | | | |
|---|---|---|---|
| 12,140,701 B2 * | 11/2024 | Marathe ................. | G01S 17/89 |
| 2005/0041392 A1 * | 2/2005 | Chen ................. | H05K 7/20727 |
| | | | 361/695 |
| 2008/0062641 A1 * | 3/2008 | Lai ........................ | H01L 23/467 |
| | | | 257/E23.099 |
| 2020/0191614 A1 * | 6/2020 | Ellgas .................... | G01D 11/24 |
| 2021/0063093 A1 * | 3/2021 | Tobiassen .............. | G01S 17/88 |
| 2022/0196801 A1 * | 6/2022 | Robertson, Jr. ....... | G01S 7/4813 |
| 2022/0236382 A1 * | 7/2022 | Krishnan ............. | G01S 7/4817 |
| 2023/0025984 A1 * | 1/2023 | Karayacoubian .. | B60H 1/00271 |
| 2023/0184895 A1 * | 6/2023 | Kazandjian .......... | G01S 7/4813 |
| | | | 73/431 |

* cited by examiner

*Primary Examiner* — Mandeep S Buttar
(74) *Attorney, Agent, or Firm* — Birch, Stewart, Kolasch & Birch, LLP

(57) ABSTRACT

An optical apparatus including a housing having a window, the housing configured to accommodate a laser emitting device configured to emit laser pulses to an outside of the optical apparatus through the window; a fan configured to generate an airflow; and a conditioning element having a plurality of fins defining a first portion configured to receive the airflow from the fan, the contoured fins having a second portion curved relative to the first portion.

4 Claims, 13 Drawing Sheets
(12 of 13 Drawing Sheet(s) Filed in Color)

200

230

210

250

220

240

100

120

160

140

200

SYSTEMS AND METHODS FOR ENVIRONMENTAL CONTROL OF VEHICLE SENSING SYSTEMS

CROSS REFERENCE TO RELATED APPLICATIONS

This application claims the benefit under 35 U.S.C. § 119(e) to U.S. Provisional Application No. 63/400,469, filed on Aug. 24, 2022, which is hereby expressly incorporated by reference into the present application.

BACKGROUND OF THE INVENTION

1. Field of the Invention

The present disclosure relates to a system and method for an environmental control of vehicle sensing systems.

2. Background of the Invention

Autonomous vehicles AVs) use a plurality of sensors for situational awareness. The sensors, which are part of a self-driving system (SDS) in the AV, include one or more of a camera, lidar (Light Detection and Ranging) device, inertial measurement unit (IMU), etc. The sensors such as cameras and lidar are used to capture and analyze scenes around the AV. The captured scenes are then used to detect objects including static objects such as fixed constructions, and dynamic objects such as pedestrians and other vehicles. In addition, data collected from the sensors can also be used to detect conditions such as road markings, lane curvature, traffic lights and signs, etc. Further, a scene representation such as 3D point cloud obtained from the AV's lidar can be combined with one or more images from the cameras to obtain further insight to the scene or situation around the AV.

Often when sensing technology like lidars, cameras, ultrasonics, radars, etc., are integrated into vehicles or other industrial platforms, environmental conditions impact sensing performance, such as heat, debris, or condensation. A network of pressurized air or liquid cooling systems can be used to mitigate the negative effect of the environmental conditions. However, these solutions are complex and require additional engineering to properly route cooling pipes throughout the platform without losing sensor performance.

SUMMARY OF THE INVENTION

Accordingly, one object of the present disclosure is to provide a system and method of cleaning and cooling/heating operations for a vehicle sensing system (e.g., a lidar sensor).

Another object of the present disclosure is to provide a guide to direct air flow from a fan to a window provided in a housing.

To achieve these and other advantages and in accordance with the purpose of the present invention, as embodied and broadly described herein, the present disclosures provides in one aspect an optical apparatus including a housing having a window, and configured to accommodate electronic equipment, a fan configured to generate an airflow, and a conditioning element having a plurality of contoured fins defining a first portion configured to receive the airflow from the fan. The contoured fins have a second portion curved relative to the first portion and direct the airflow onto the window to provide conditioned air to the window.

The contoured fins can be accurate and parallel to each other. In addition, the optical apparatus includes a frame covering the conditioning element, where the frame includes a shroud covering the contoured fins. The shroud also includes an inlet on the bottom surface and an outlet on a side surface.

In another aspect, the present disclosure provides a vehicle sensing system including an optical element containing sensor electronics. A housing having at least one window is aligned with at least one of the sensor electronics within the housing. Also included is a fan arranged on the housing to provide airflow through the housing. A conditioning element is also provided FIG. to receive the airflow from the fan to cool the sensor electronics. The conditioning element includes fins configured to receive the airflow and to direct conditioned air onto the window to provide the conditioned air to the window. The conditioned air can be a cooled air to cool the sensor window or warmed air to warm the sensor window in colder environments. The conditioned air can also be supplied at a certain velocity to perform cleaning operations.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention will become more fully understood from the detailed description given hereinbelow and the accompanying drawings, which are given by illustration only, and thus are not limitative of the present invention, and wherein.

DETAILED DESCRIPTION OF THE INVENTION

Reference will now be made in detail to the preferred embodiments of the present invention, examples of which are illustrated in the accompanying drawings.

Figure 1:
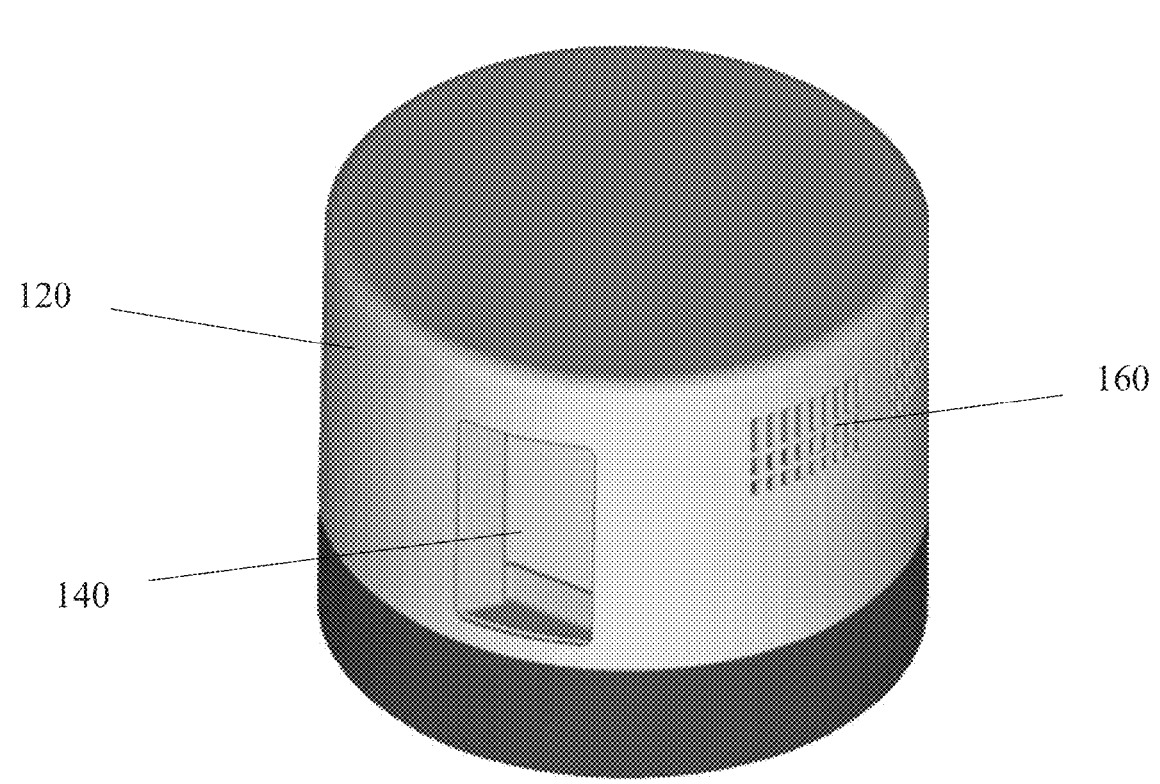
FIG. 1 is a perspective view of an optical apparatus according to an embodiment of the present disclosure.

An optical sensor 100 illustrated in FIG. 1 has a cover 120 to protect the elements within the optical element 100. The cover 120 has an opening 140 aligned with a window described below. The cover 120 also includes vent holes 160 to allow for air flow in the cover 120. The cover is shown as being cylindrical in FIG. 1, but can be any suitable shape.

Figure 2A:
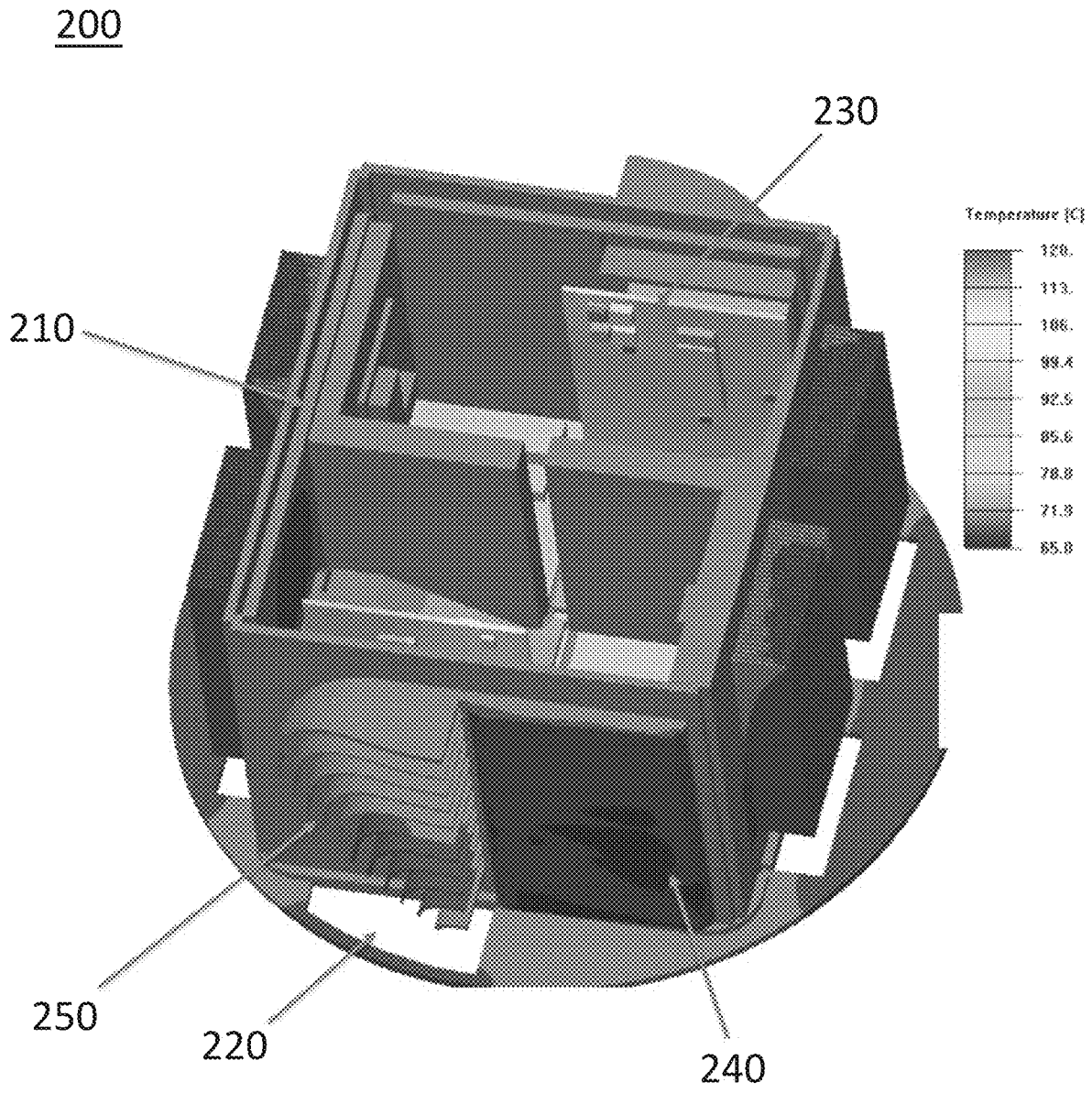
FIGS. 2A-2C is a perspective view of the optical apparatus according to an embodiment of the present disclosure with the cover removed.

FIG. 2A illustrates a housing 200 with the cover 120 removed from the optical element 100. As shown, the housing 200 has an inner housing 210 on a base 220. The housing 200 accommodates electronic equipment 230 including laser diodes, circuit boards and other hardware components such as Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, and other electronic units.

A window 240 in the housing 200 allows for the passage of light, such as laser light, generated in the housing to be emitted out of the housing 200. As shown in FIGS. 1 and 2A, the opening 140 of the cover 120 is aligned with the window 240, so the laser light is transmitted out of the optical element 100. The window 240 also allows reflected laser light to be received into the housing 200 and detected by receiver optics included within the housing 200. A conditioning element 250 extends from a housing wall having the window 240. As shown, the conditioning element 250 includes arcuate fins extending from the wall of the inner housing 210. In more detail, the fins 250 create inlets and outlets for air flow. In one embodiment, the fins 250 are arcuate and parallel to each other to form air passages. Openings in the base 220 also allow for the passage of air. The shape of the fins also advantageously creates an increased speed of the airflow onto the window 240.

Thus, the conditioning element 250 serves to both cool electronic equipment 230 within the housing 210, as well as use the same air to clean the window 240. In one embodiment, a fan is arranged below the housing 210 and provides air to the contoured or bent fins of the conditioning element 250 that both dissipates heat and delivers the air used to cool the electronic equipment 230 to the window 240. The air blown onto the window 240 advantageously cleans debris from the window 240.

In addition, the housing 210 also houses a camera assembly used to capture images of the surrounding area of the vehicle. Thus, in one embodiment, the housing 210 can secure the conditioning element 250 with the fins extending from the back of the camera body. In addition, the fan forces air over the pin-shaped fins, through an exhaust duct to exhaust the air onto the camera lens. The recycled air can also be warmed by the fins prior to being used to clean the window or lens. Thus, the embodiment of the present disclosure cools, heats and cleans the optical element without the need for additional parts, liquid cooling, etc.

Figure 2B:
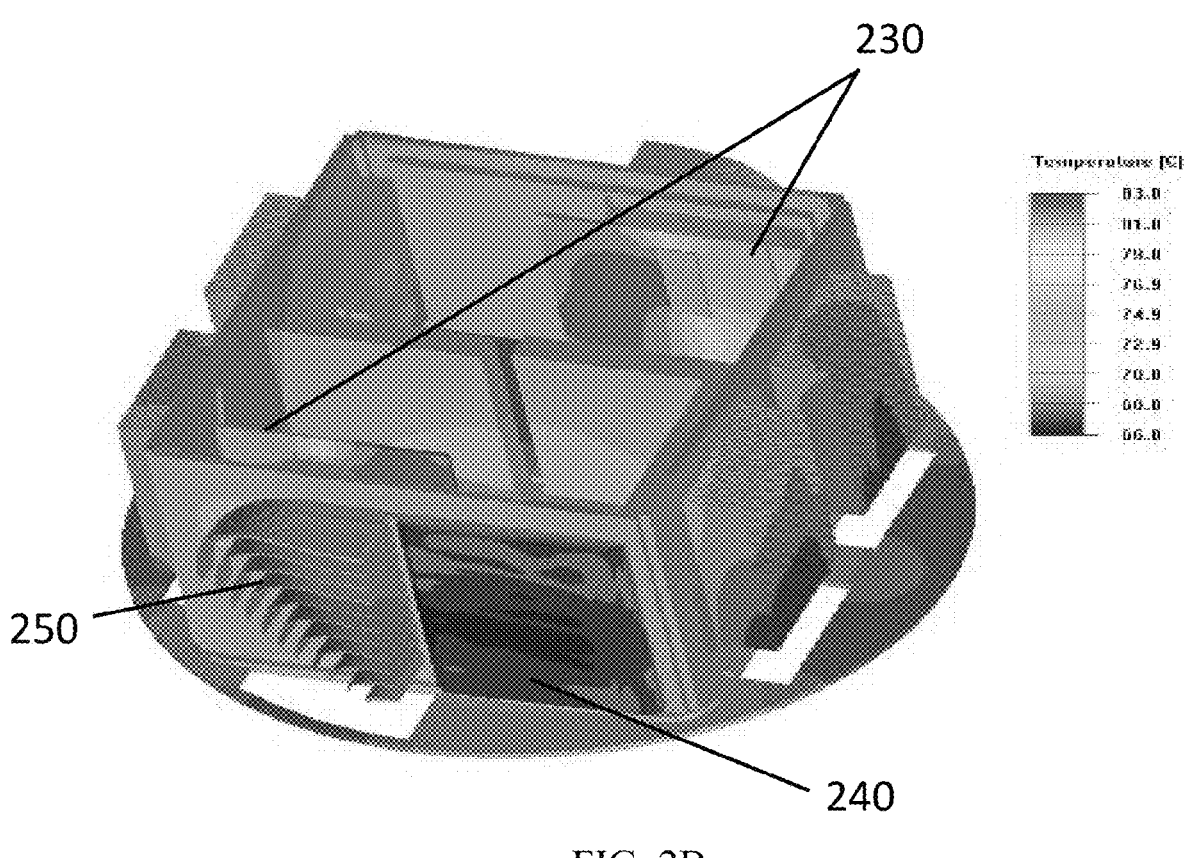

Further, FIGS. 2A and 2B illustrate different temperatures of the components included in the housing 210. As shown in FIG. 2A, the processing chips of the electronic components 230 reach a high temperature of 120° C. FIG. 2A also illustrates the advantageously cooled fins 250 and surrounding area. FIG. 2B also illustrates the electronic components 230 reaching a high temperature and the window 240 being sufficiently cooled.

Figure 2C:
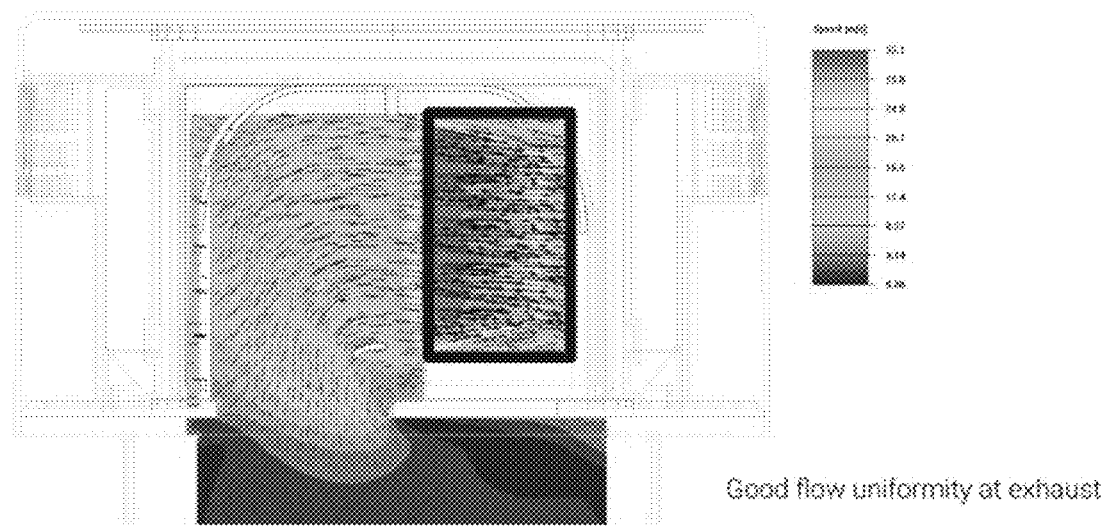

In addition, the window 240 can be flush with the fin assembly output, thereby increasing the airflow speed traversing the window 240. FIG. 2C is an overview illustrating measured air speed traversing the window 240. As shown in FIG. 2B, the speed increases to 33.1 m/s. FIG. 2B also illustrates good flow uniformity at the exhaust. This strong uniform flow rate of the air increases the cleaning capacity of the system.

Figure 3:
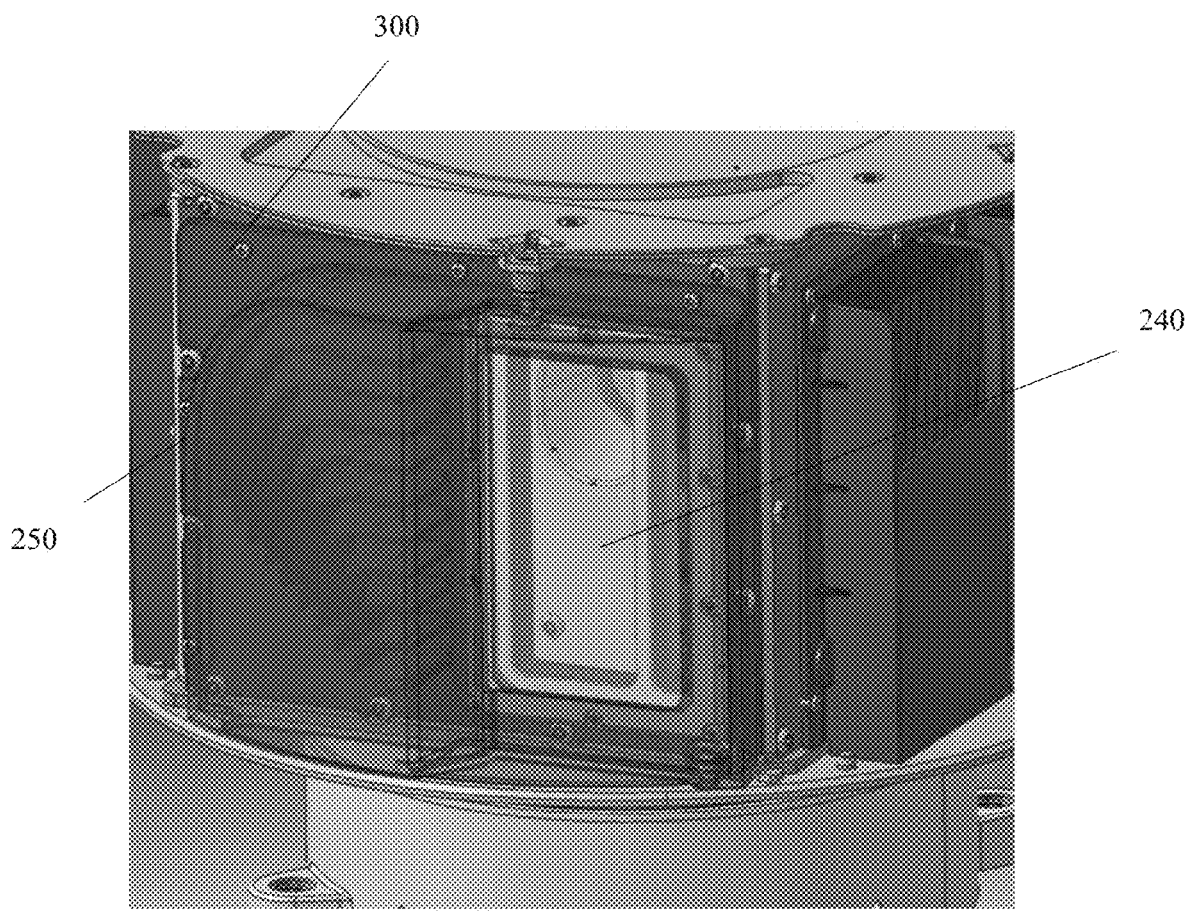
FIG. 3 is a front view of the window and conditioning element according to an embodiment of the present disclosure.

In another embodiment, and as shown in FIG. 3, the fins 250 can be covered by a frame 300 to direct the output air directly onto the window 240. In particular, the frame 300 operates as a duct to additionally focus the direction of airflow over the fins, and subsequently over the face of a lens of the sensing unit in addition to the window 240.

Figure 4:
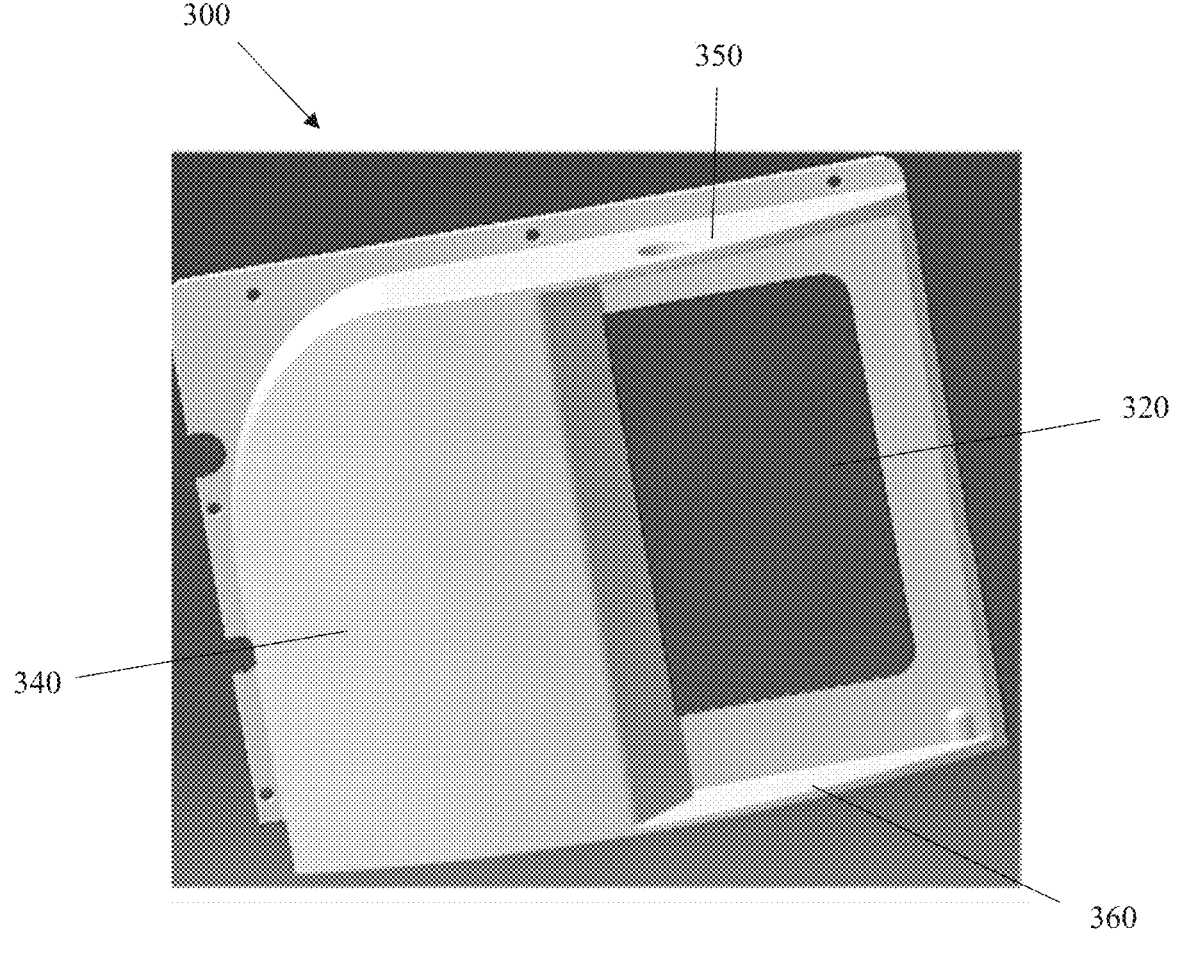
FIG. 4 is a view of a frame used with the conditioning element according to an embodiment of the present disclosure.

FIG. 4 is an overview of the frame 300. As shown in FIG. 4, the frame 300 includes a shroud or cover 340 to direct air flow through passages created by the fins 250 onto the window 240. The frame 300 includes an opening 320 corresponding to the window 240 when the frame 300 is attached to the housing 210 and the shroud 340 that covers the fins 250. The frame 300 also includes an upper guide 350 and lower guide 360 extend from the shroud 340. Thus, when the frame 300 is installed over the fins 250, the air is advantageously forced with an increased speed onto the window 240 thereby cleaning debris from the window while also cooling the elements within the apparatus.

Figure 5:
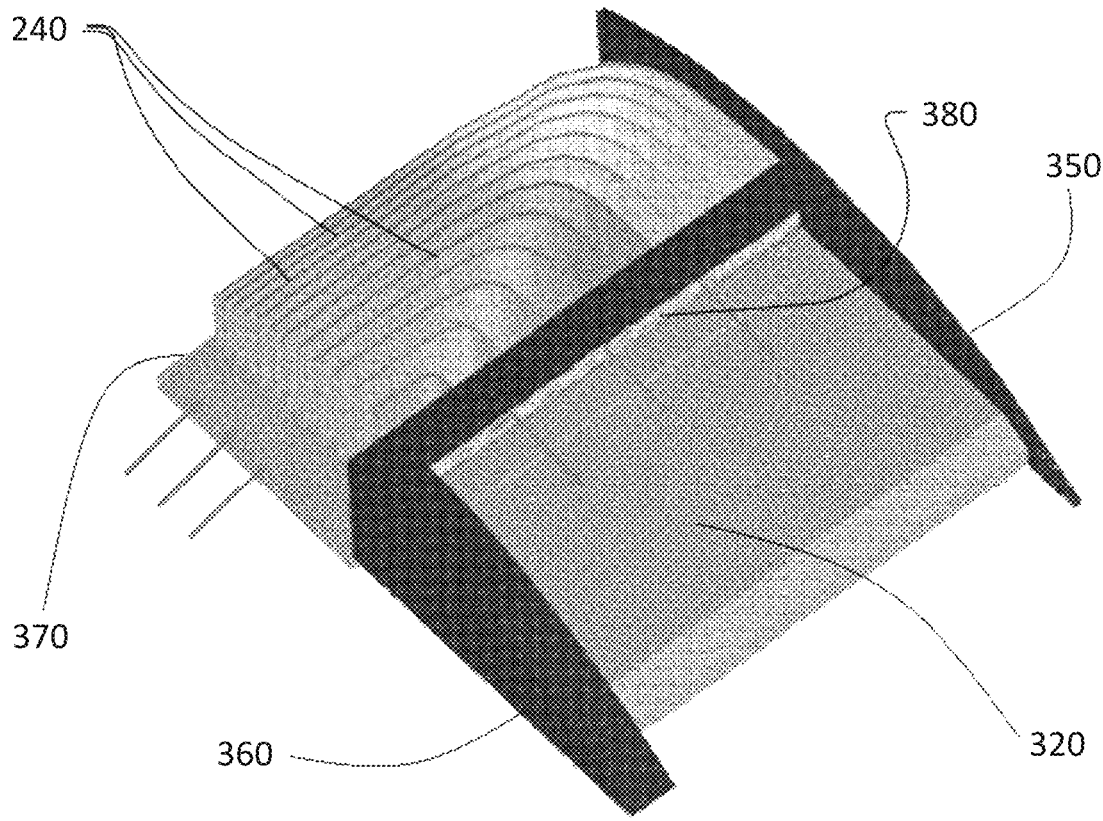
FIG. 5 is a perspective view of a guide used with the conditioning element according to an embodiment of the present disclosure.

Next, FIG. 5 is an exploded view showing a portion of the shroud 340 removed to expose the fins 250 of the conditioning element 250. As shown in FIG. 5, air flows into the inlet 370 and onto the fins 250. The advantageous shape of the fins 250 then guides the air to an outlet 380. That is, the fins 250 have an arcuate shape to direct the air flow to the outlet 380. Therefore, the air flow flows across the window 240. In addition, as shown in FIG. 5, the air is further guided by the upper guide 350 and lower guide 360 to provide maximum air flow across the window 240 is ensured.

Figure 6:
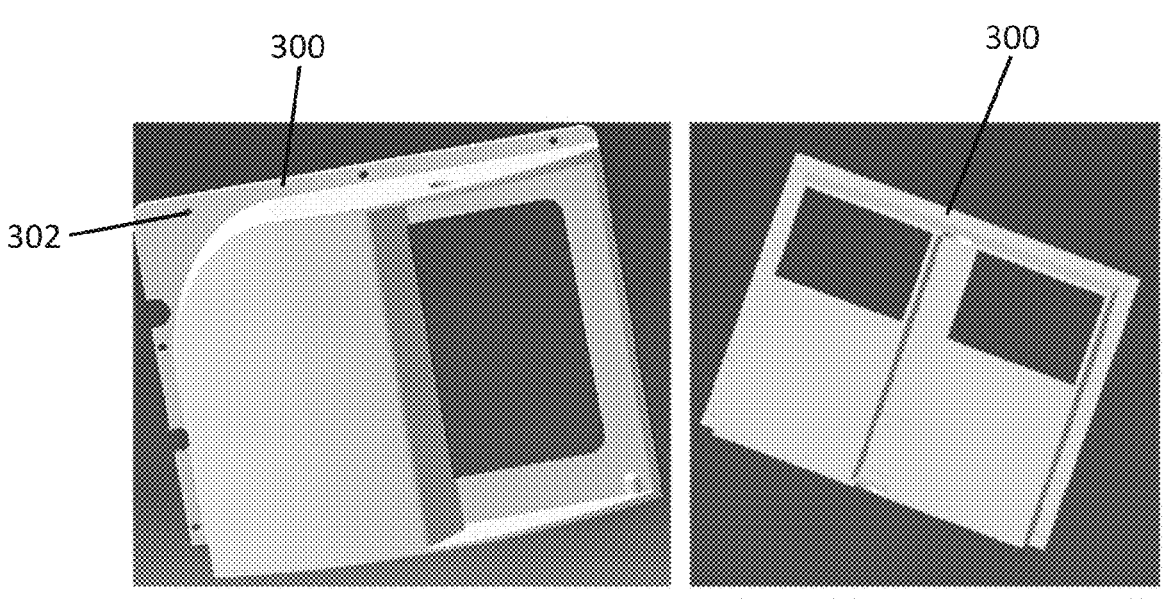
FIG. 6 includes different views of the guide shown in FIG. 5.

FIG. 6 includes different views of the frame 300 shown in FIG. 5. As shown in the left drawing of FIG. 6, the frame 300 includes mounting portions 302 for mounting the frame 300. Thus, with the frame 300 sufficiently secured to cover the fins 240, the input air is forced onto the window 240 as described above. The right drawing in FIG. 6 illustrates an underside or alternative view of the frame 300.

Figure 7:
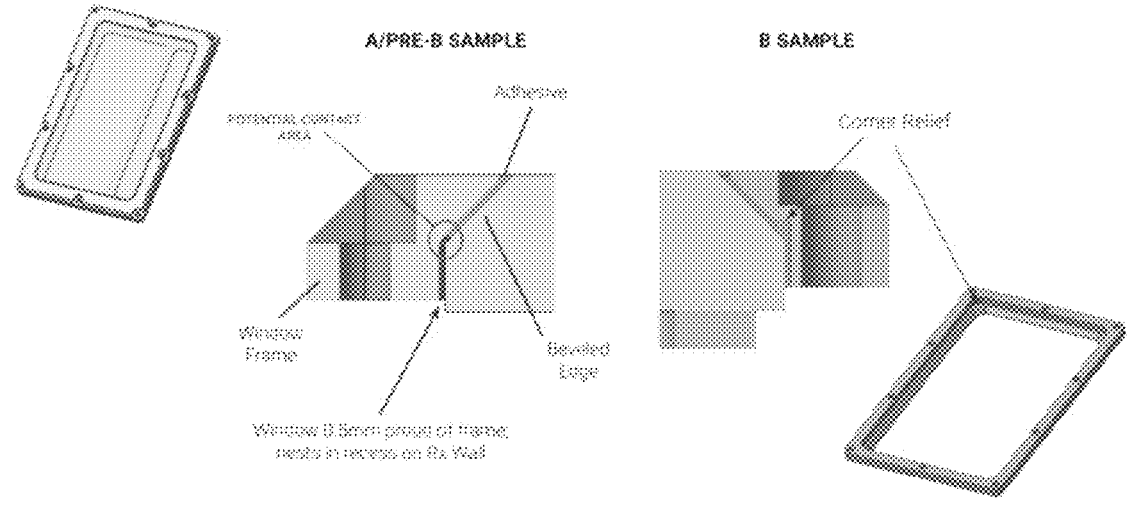
FIG. 7 is an overview illustrating manufacturing details of the guide according to an embodiment of the present disclosure.

Next, FIG. 7 is an overview illustrating manufacturing details of the frame 300 according to an embodiment of the present disclosure. As shown in FIG. 7, the A/PRE-B sample includes a potential contact area near the beveled edge of the frame. Adhesive is also applied to the beveled edge. The B sample illustrate the corner relief provided at corners of the frame 300.

Figure 8:
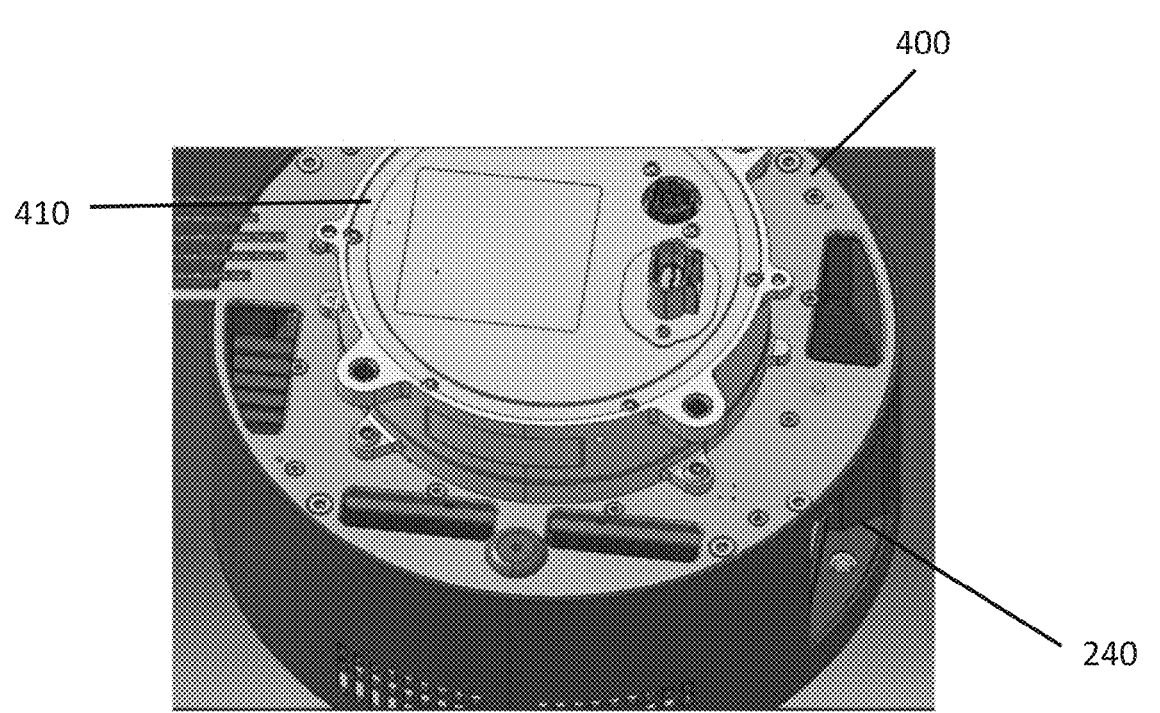
FIG. 8 is an overview illustrating different air speeds measured during operation of the vehicle sensing system according to an embodiment of the present disclosure.
Figure 9:
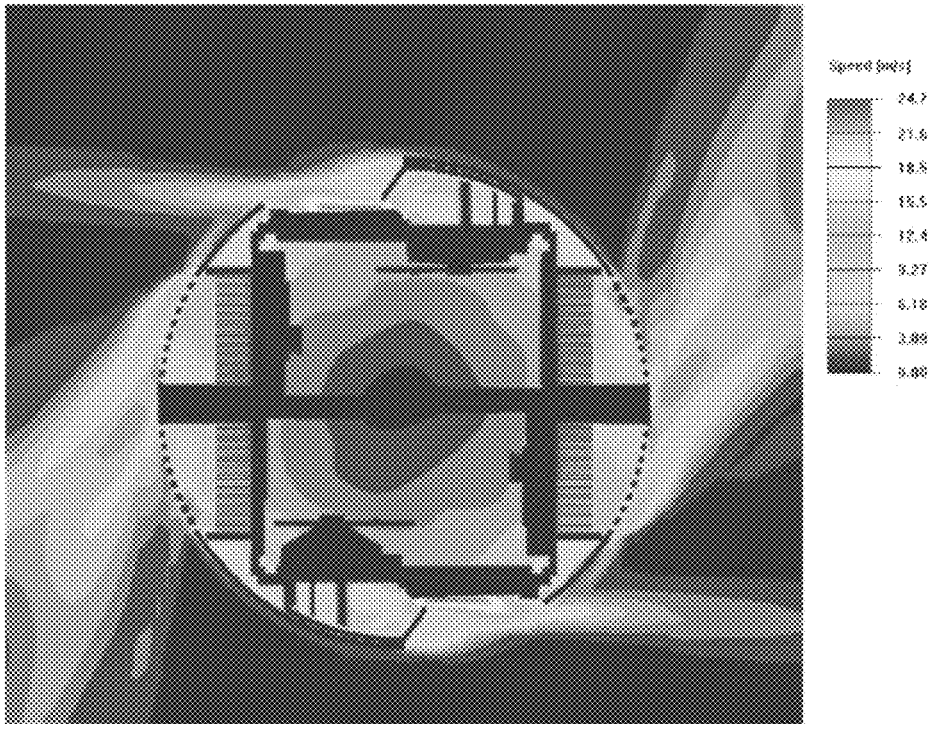
FIG. 9 is an overview illustrating the different air speeds passing through the optical transmitter according to an embodiment of the present disclosure.
Figure 10:
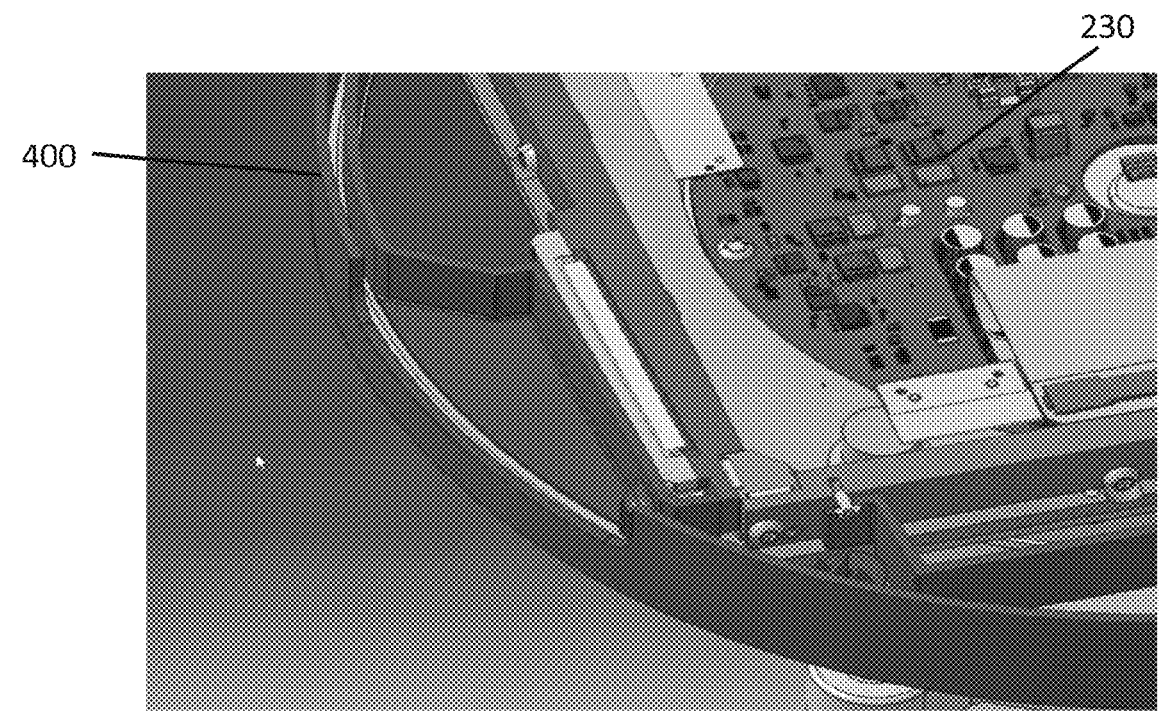
FIG. 10 is an overview of electronics arranged within the optical transmitter corresponding to the measurement shown in FIG. 9.

Next, FIGS. 8-10 illustrate the different air speeds measured during operation of the vehicle sensing system. In more detail, FIG. 8 illustrates an overview of an optical transmitter 400 including a laser diode array configured to emit corresponding laser pulses. The optical transmitter 400 is rotated via a drive motor 410 so the scanning beam covers a horizontal field of view. As shown in FIG. 8, the optical transmitter 400 includes a cylindrical shape and is rotated at high speeds to view all areas surrounding the vehicle. The laser pulses are emitting to the outside though the window 240. Thus, as the vehicle is traveling along the road, for example, the optical transmitter is continuously rotated to capture detection information about objects surrounding the vehicle. FIG. 9 illustrates the different air speeds passing through the optical transmitter 400. FIG. 10 includes an overview of the electronics 230 arranged within the optical transmitter 400 corresponding to the measurement shown in FIG. 9.

Figure 11:
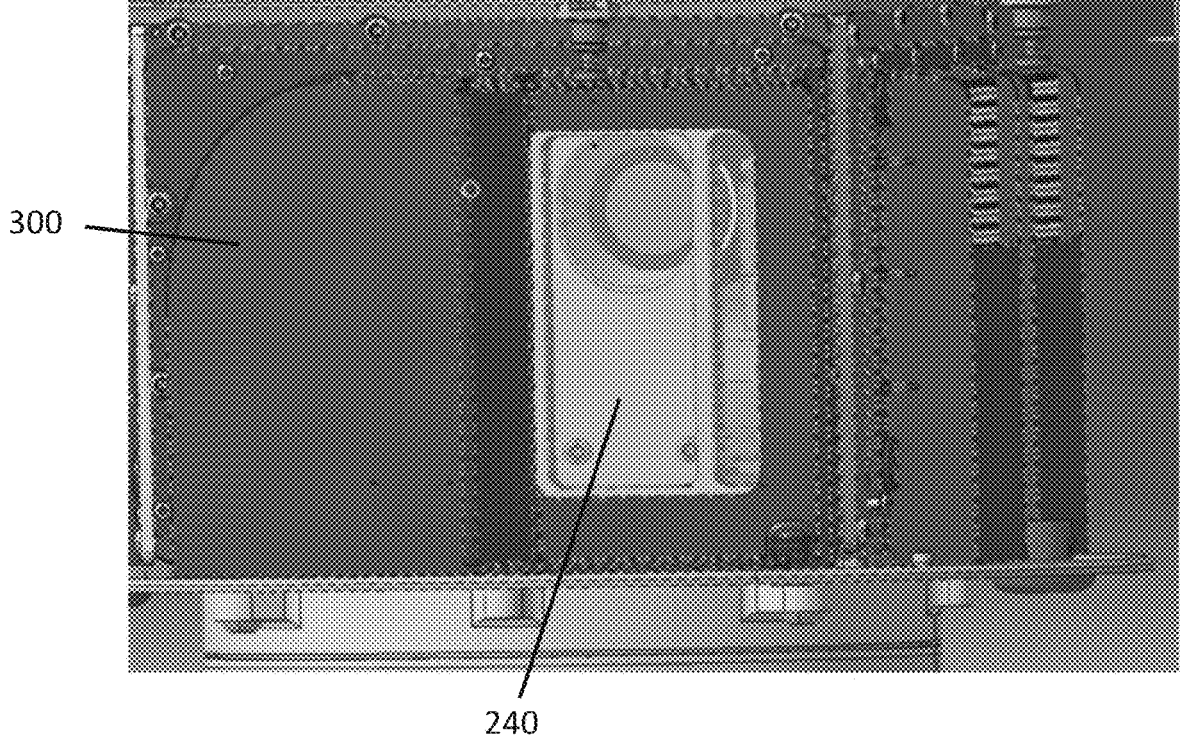
FIGS. 11-18 illustrate a variety of different views of the sensing apparatus according to an embodiment of the present disclosure.
Figure 12:
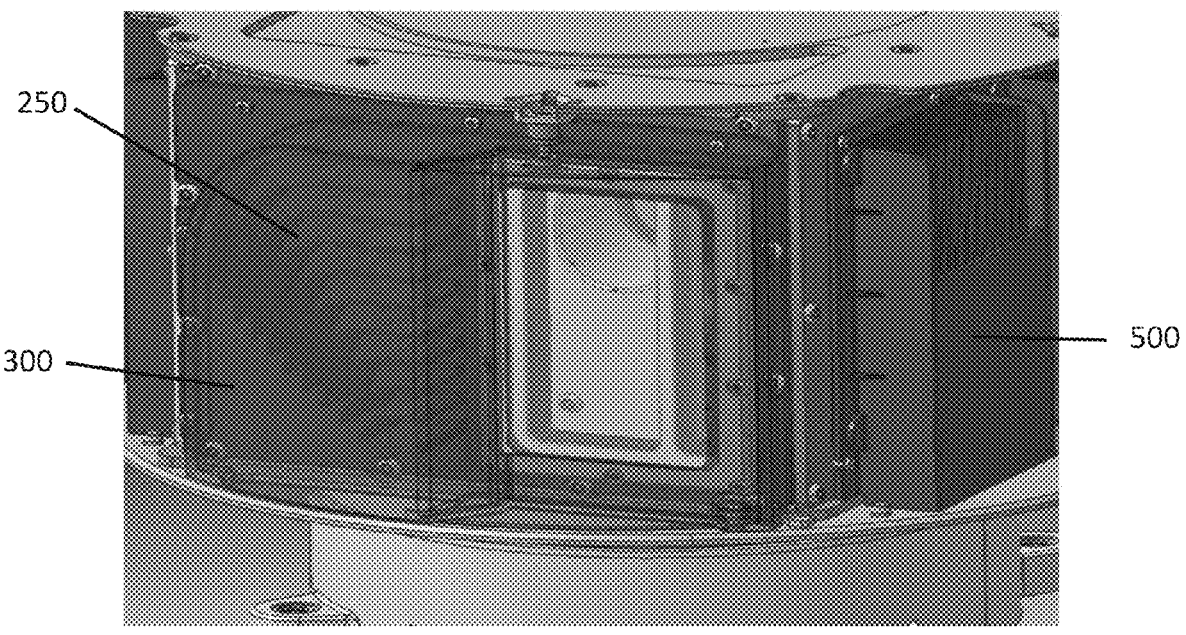

Next, FIGS. 11-19 illustrate a variety of different views of the sensing apparatus. For example, FIG. 11 illustrates the frame 300 covering the fins 250 such that the fins are not viewable from an outside. FIG. 11 also illustrates the transmission window 240. FIG. 12 is a similar view to FIG. 11, except the fins 250 are visible to the outside. For example, the frame 300 can be a transparent material so the fins 250 can be viewed from the outside. This differs from the embodiment shown in FIG. 11 in which the fins 250 are not visible from the outside. FIG. 12 also illustrates heat sinks 500 to remove heat generated within the apparatus. As shown in FIG. 12, the heat sinks 500 include a plurality of radiating fins.

Figure 13:
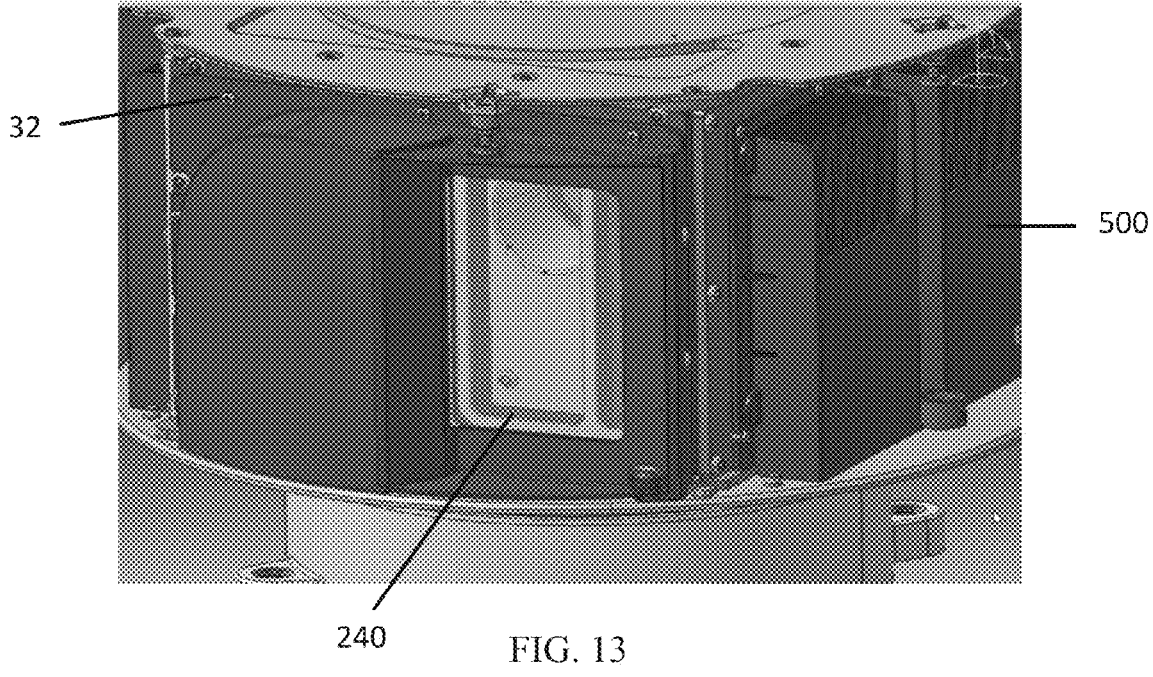
Figure 14:
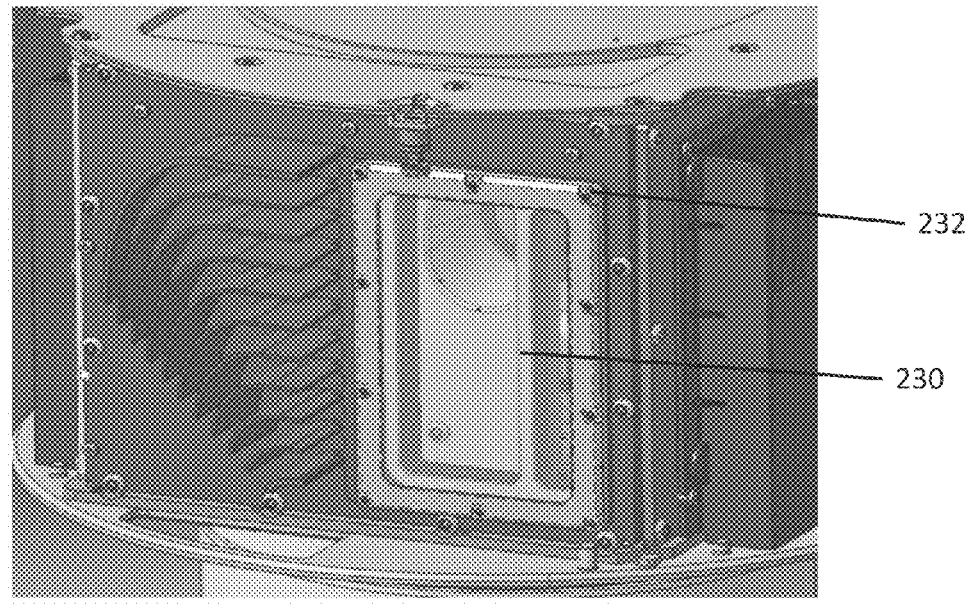
Figure 15:
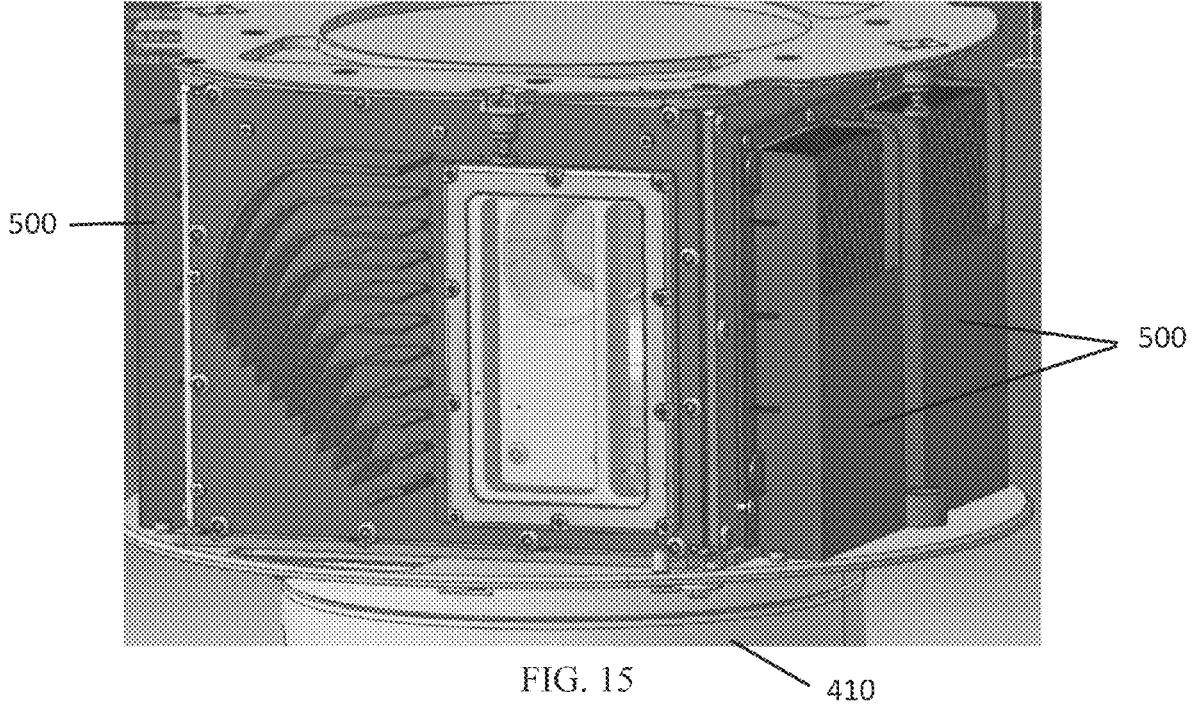
Figure 16:
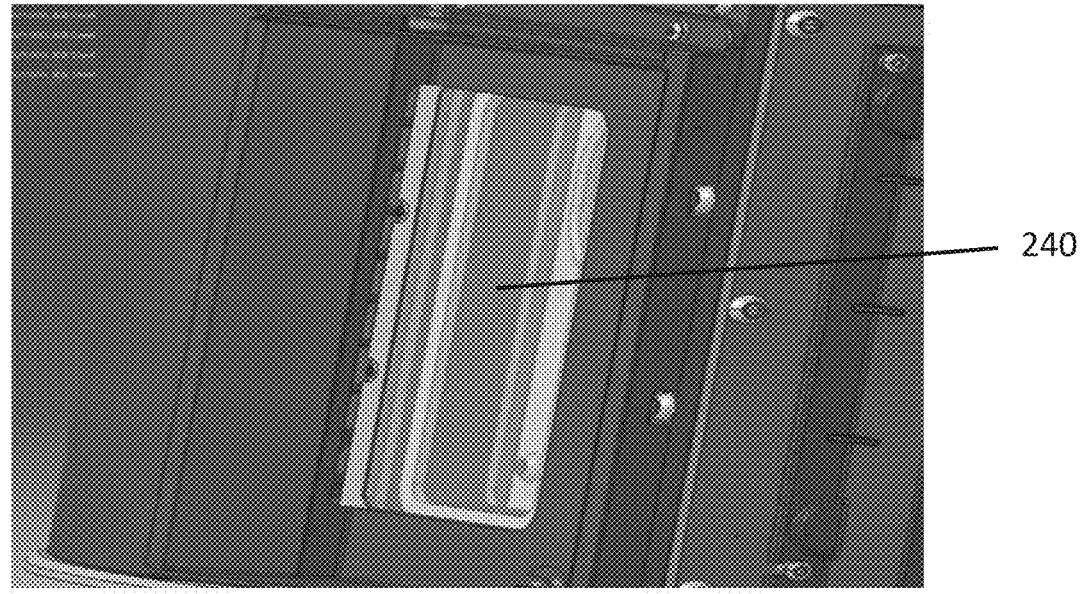

In addition, FIG. 13 illustrates fasteners 32 used to secure the frame 300 to the device, and the fasteners 32 can include screws, bolts, or the like. Alternatively, the frame 300 can be fastened or coupled to the device by an adhesive. FIG. 13 also illustrates dual heat sinks 500 mounted to the device. FIG. 14 illustrates the window 230 being secured using fasteners 232. The frame 300 is shown as being removed in the illustration of FIG. 14. Further, FIG. 15 illustrates a clear view of the dual heat sinks 500 mounted on one surface of the device. A same set of dual heat sinks 500 can be mounted on an opposite surface of the device as shown in FIG. 15, which increases the amount of heat transferred to an outside of the device while simultaneously providing a balancing effect between the sets of heat sinks. This is particularly advantageous because the device is rotated at a high speed and the heat sinks on opposite sides of the device as shown in FIG. 15 attribute to balancing the rotation of the device. FIG. 15 also illustrates the motor 410 that is used to rotate the optical sensor. Further. FIG. 16 is a close-up view of the transmission window 240.

Figure 17:
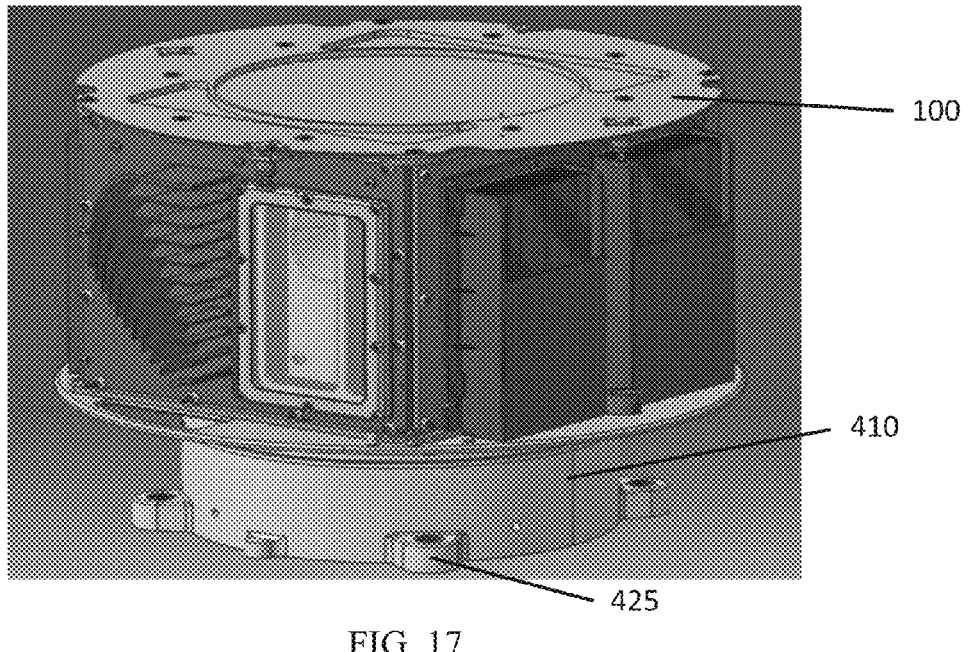
Figure 18:
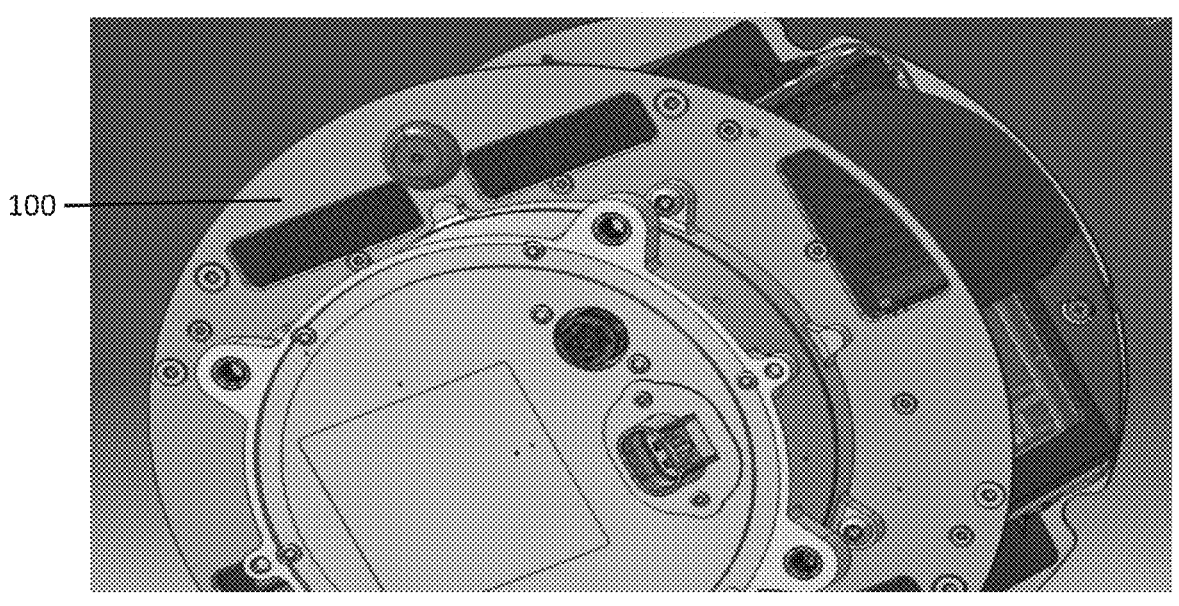

In addition, FIG. 17 illustrates the drive motor 410 including coupling mechanisms 425 used to mount the optical sensor 100 to a vehicle platform. The cover 120 is removed in the illustration of FIG. 17 (see FIG. 1). FIG. 18 is a close-up view of the optical sensor 100.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An optical apparatus comprising:

a cover having a vent hole to allow an airflow into the cover and a cover opening connected to a window;

a housing having the window, the housing configured to accommodate a laser emitting device configured to emit laser pulses to an outside of the optical apparatus through the window;

a fan disposed beneath the housing and configured to generate the airflow;

a conditioning element having a plurality of fins defining a first portion configured to receive the airflow from the fan, the fins having a second portion curved relative to the first portion and configured to direct the airflow onto a window to provide conditioned air to the window;

a frame covering the conditioning element; and a dual heat sink for removing heat generated by the apparatus, wherein the housing comprises a base and an inner housing formed on the base, wherein the base includes a base opening to allow the airflow, wherein the frame includes a shroud covering the plurality of fins, and wherein the dual heat sink has a plurality of radiating fins mounted on both one side and an opposite side of the inner housing.

2. The optical apparatus of claim 1, wherein the fins are accurate and parallel to each other.

3. The optical apparatus of claim 1, wherein the shroud has an inlet in a bottom surface and an outlet in a side surface.

4. The optical apparatus of claim 1, wherein the housing further includes a camera assembly used to capture images of a surrounding area of a vehicle, the camera assembly includes a camera body, and the camera body secures the conditioning element with the plurality of fins extending from the back of the camera body.

* * * * *